United States Patent
Koshimizu

(10) Patent No.: US 12,046,452 B2
(45) Date of Patent: Jul. 23, 2024

(54) PLASMA PROCESSING APPARATUS

(71) Applicant: Tokyo Electron Limited, Tokyo (JP)

(72) Inventor: Chishio Koshimizu, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 428 days.

(21) Appl. No.: 17/349,027

(22) Filed: Jun. 16, 2021

(65) Prior Publication Data

US 2021/0407772 A1 Dec. 30, 2021

(30) Foreign Application Priority Data

Jun. 26, 2020 (JP) .............................. 2020-110513
Apr. 14, 2021 (JP) .............................. 2021-068312

(51) Int. Cl.
    *H01J 37/32* (2006.01)

(52) U.S. Cl.
    CPC .. *H01J 37/32183* (2013.01); *H01J 37/32568* (2013.01); *H01J 37/32642* (2013.01); *H01J 37/32715* (2013.01); *H01J 2237/2007* (2013.01); *H01J 2237/334* (2013.01)

(58) Field of Classification Search
    CPC .......... H01J 37/32091; H01J 37/32174; H01J 37/32183; H01J 37/32568; H01J 37/32577; H01J 37/32642; H01J 37/32715; H01J 2237/334; H01J 2237/2007

See application file for complete search history.

(56) References Cited

U.S. PATENT DOCUMENTS

| | | | | |
|---|---|---|---|---|
| 6,042,686 A | * | 3/2000 | Dible | H01J 37/32009 156/345.44 |
| 6,649,021 B2 | * | 11/2003 | Ohmoto | H01J 37/32706 156/345.43 |
| 2006/0066247 A1 | * | 3/2006 | Koshiishi | H01J 37/32834 315/111.21 |
| 2006/0196605 A1 | * | 9/2006 | Ikegami | H01J 37/32706 118/728 |
| 2008/0236749 A1 | * | 10/2008 | Koshimizu | H01J 37/32348 156/345.33 |
| 2010/0006225 A1 | * | 1/2010 | Yokogawa | H01J 37/32935 156/345.28 |
| 2010/0203736 A1 | * | 8/2010 | Ichino | H01J 37/32183 257/E21.218 |
| 2011/0031217 A1 | * | 2/2011 | Himori | H01J 37/32165 156/345.48 |
| 2018/0204757 A1 | * | 7/2018 | Fushimi | H01L 21/6831 |
| 2019/0122864 A1 | * | 4/2019 | Aramaki | H01J 37/32174 |

FOREIGN PATENT DOCUMENTS

JP     2008-227063 A     9/2008

* cited by examiner

*Primary Examiner* — Benjamin Kendall
(74) *Attorney, Agent, or Firm* — Studebaker & Brackett PC

(57) ABSTRACT

The disclosed plasma processing apparatus includes a chamber, a substrate support, a radio frequency power source, and a bias power source. The radio frequency power source generates radio frequency power to generate plasma. The bias power source is connected to a bias electrode of the substrate support, and generates an electric bias. An edge ring mounted on the substrate support receives a part of the electric bias through an impedance adjuster or receives another electric bias. An outer ring extends outside the edge ring in a radial direction, and receives a part of the radio frequency power or other radio frequency power.

2 Claims, 4 Drawing Sheets

PLASMA PROCESSING APPARATUS

CROSS-REFERENCE TO RELATED APPLICATIONS

This application is based on and claims the benefit of priority from Japanese Patent Application Nos. 2020410513 filed on Jun. 26, 2020 and 2021-068312 filed on Apr. 14, 2021, the entire contents of which are incorporated herein by reference.

FIELD

Exemplary embodiments of the present disclosure relate to a plasma processing apparatus.

BACKGROUND

A plasma processing apparatus is used for plasma processing on a substrate. The plasma processing apparatus is provided with a chamber, an electrostatic chuck, and a lower electrode. The electrostatic chuck and the lower electrode are provided in the chamber. The electrostatic chuck is provided on the lower electrode. The electrostatic chuck supports an edge ring placed thereon. The edge ring is sometimes called a focus ring. The electrostatic chuck supports a substrate disposed in a region surrounded by the edge ring. When the plasma processing is performed in the plasma processing apparatus, a gas is supplied into the chamber. Further, radio frequency power is supplied to the lower electrode. Plasma is formed from the gas in the chamber. The substrate is processed with chemical species such as ions and radicals from the plasma.

When the plasma processing is performed, the edge ring is worn and the thickness of the edge ring is reduced. If the thickness of the edge ring is reduced, the position of the upper end of a plasma sheath (hereinafter referred to as a "sheath") above the edge ring becomes lower. The position in the vertical direction of the upper end of the sheath above the edge ring has to be equal to the position in the vertical direction of the upper end of the sheath above the substrate. Japanese Unexamined Patent Publication No. 2008-227063 discloses a plasma processing apparatus that allows the position in the vertical direction of the upper end of a sheath above an edge ring to be adjusted. The plasma processing apparatus disclosed in Japanese Unexamined Patent Publication No. 2008-227063 is configured to apply a direct-current voltage to the edge ring. Further, the plasma processing apparatus disclosed in Japanese Unexamined Patent Publication No. 2008-227063 is configured to adjust a power level of radio frequency power that is supplied to a lower electrode, when applying the direct-current voltage to the edge ring.

SUMMARY

In an exemplary embodiment, a plasma processing apparatus is provided. The plasma processing apparatus includes a chamber, a substrate support, a radio frequency power source, and a bias power source. The substrate support has a bias electrode. The radio frequency power source is configured to generate radio frequency power that is supplied to a radio frequency electrode to generate plasma above a substrate supported by the substrate support in the chamber. The bias power source is connected to the bias electrode through an electrical path. An edge ring is mounted on the substrate support. The edge ring is electrically connected to the bias power source through an impedance adjuster that provides variable impedance between the bias electrode and the edge ring or between the electrical path and the edge ring, or electrically connected to another bias power source. An outer ring extends outside the edge ring in a radial direction. The outer ring is electrically connected to the radio frequency power source to receive part of the radio frequency power or electrically connected to an other radio frequency power source to receive other radio frequency power.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
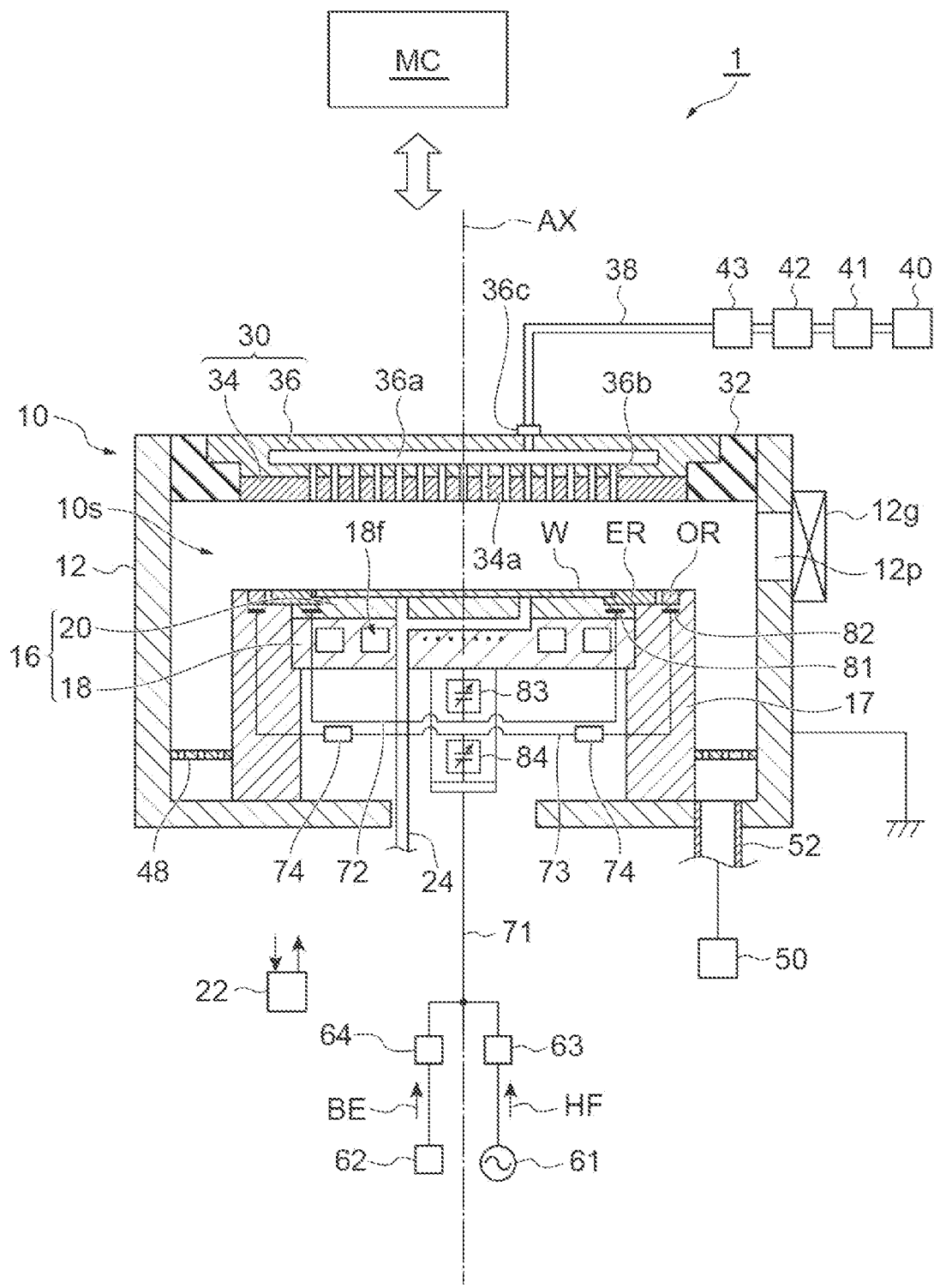
FIG. 1 schematically illustrates a plasma processing apparatus according to an exemplary embodiment.

Hereinafter, various exemplary embodiments will be described.

In an exemplary embodiment, a plasma processing apparatus is provided. The plasma processing apparatus includes a chamber, a substrate support, a radio frequency power source, and a bias power source. The substrate support has a bias electrode. The radio frequency power source is configured to generate radio frequency power that is supplied to a radio frequency electrode to generate plasma above a substrate supported by the substrate support in the chamber. The bias power source is connected to the bias electrode through an electrical path. An edge ring is mounted on the substrate support. The edge ring is electrically connected to the bias power source through an impedance adjuster that provides variable impedance between the bias electrode and the edge ring or between the electrical path and the edge ring, or electrically connected to another bias power source. An outer ring extends outside the edge ring in a radial direction. The outer ring is electrically connected to the radio frequency power source to receive part of the radio frequency power or electrically connected to an other radio frequency power source to receive other radio frequency power.

According to the above embodiment, the level of a negative bias in the edge ring is adjusted by an impedance adjuster or another bias power source. Therefore, according to the above embodiment, it becomes possible to adjust the thickness of a sheath on the edge ring. Further, in the above embodiment, part of the radio frequency power or other radio frequency power is supplied to the outer ring. Therefore, according to the above embodiment, the density of the plasma is adjusted even above the outer ring. Therefore, according to the above embodiment, it becomes possible to adjust the distribution of the density of the plasma in the radial direction in a space that also includes a region outside the region on the edge ring.

In an exemplary embodiment, the plasma processing apparatus may further include a first electrode and a second electrode. The first electrode is electrically coupled to the edge ring. The first electrode may be capacitively coupled to the edge ring. The second electrode is electrically coupled to the outer ring. The second electrode may be capacitively coupled to the outer ring. The impedance adjuster provides variable impedance between the bias electrode and the first electrode or between the electrical path and the first electrode. The outer ring receives the part of the radio frequency power or the other radio frequency power from the other radio frequency power source through the second electrode.

In an exemplary embodiment, the substrate support may have a base and an electrostatic chuck provided on the base.

In an exemplary embodiment, the base may provide a lower electrode that is the bias electrode. The lower electrode may be the radio frequency electrode. In the embodiment, the radio frequency power source may be electrically connected to the lower electrode through the electrical path.

In an exemplary embodiment, the plasma processing apparatus may further include an impedance adjuster. The impedance adjuster provides variable impedance between the electrical path and the outer ring or between the lower electrode and the outer ring.

In an exemplary embodiment, the plasma processing apparatus may further include a filter connected between the impedance adjuster, which provides variable impedance between the electrical path and the outer ring or between the lower electrode and the outer ring, and the second electrode. The filter may have a frequency characteristic that selectively passes the radio frequency power with respect to an electric bias that is supplied from the bias power source to the lower electrode.

In an exemplary embodiment, the bias electrode may be provided in the electrostatic chuck. The base may provide a lower electrode that is the radio frequency electrode. The radio frequency power source may be electrically connected to the lower electrode.

In an exemplary embodiment, the plasma processing may further include an impedance adjuster. The impedance adjuster provides variable impedance between an electrical path that connects the radio frequency power source to the lower electrode and the outer ring or between the lower electrode and the outer ring.

In an exemplary embodiment, the outer ring may extend to surround the edge ring.

In an exemplary embodiment, the bias power source may be configured to supply radio frequency bias power to the bias electrode or to periodically apply a pulsed voltage or a voltage having any waveform to the bias electrode. The pulsed voltage may have a negative polarity. The pulsed voltage may be a pulsed negative direct-current voltage.

Hereinafter, various exemplary embodiments will be described in detail with reference to the drawings. In the drawings, the same or equivalent portions are denoted by the same reference symbols.

FIG. 1 is a diagram schematically showing a plasma processing apparatus according to an exemplary embodiment. A plasma processing apparatus 1 shown in FIG. 1 is a capacitively coupled plasma processing apparatus. The plasma processing apparatus 1 is provided with a chamber 10. The chamber 10 provides an internal space 10s therein. The central axis of the internal space 10s is an axis AX which extends in the vertical direction.

In an embodiment, the chamber 10 may include a chamber body 12. The chamber body 12 has a substantially cylindrical shape. The internal space 10s is provided in the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. This film may be a film formed by anodization or a ceramic film such as a film formed of yttrium oxide.

A passage 12p is provided in a side wall of the chamber body 12. A substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate W is placed on the substrate support 16 such that the center thereof is located on the axis AX. The substrate support 16 is configured to further support an edge ring ER. The edge ring ER has a ring shape. The edge ring ER may have electrical conductivity. The edge ring ER is formed of, for example, silicon or silicon carbide. The edge ring ER is placed on the substrate support 16 such that the central axis thereof coincides with the axis AX. The substrate W is disposed on the substrate support 16 and in the region surrounded by the edge ring ER.

The substrate support 16 may be surrounded by an insulating portion 17. The insulating portion 17 extends in a circumferential direction outside the substrate support 16 in the radial direction with respect to the axis AX. The insulating portion 17 is formed of an insulating material such as quartz. The insulating portion 17 may support the substrate support 16.

The substrate support 16 has a base 18. The substrate support 16 may further have an electrostatic chuck 20. The base 18 and the electrostatic chuck 20 are provided in the chamber 10. The base 18 is formed of a conductive material such as aluminum and has a substantially disk shape. The central axis of the base 18 is the axis AX.

The base 18 provides a flow path 18f therein. The flow path 18f is a flow path for a heat exchange medium. The heat exchange medium is, for example, a refrigerant. The flow path 18f is connected to a supply device 22 for the heat exchange medium. The supply device 22 is provided outside the chamber 10. The flow path 18f receives the heat exchange medium that is supplied from the supply device 22. The heat exchange medium supplied to the flow path 18f is returned to the supply device 22.

The electrostatic chuck 20 is provided on the base 18. The substrate W is placed on the electrostatic chuck 20 and held by the electrostatic chuck 20 when it is processed in the internal space 10s.

The electrostatic chuck 20 has a main body and a chuck electrode. The main body of the electrostatic chuck 20 is formed of a dielectric such as aluminum oxide or aluminum nitride. The main body of the electrostatic chuck 20 has a substantially disk shape. The central axis of the electrostatic chuck 20 is the axis AX. The chuck electrode is provided in the main body of the electrostatic chuck 20. The chuck electrode has a film shape. The chuck electrode is electrically connected to a direct-current power source through a switch. When the voltage from the direct-current power source is applied to the chuck electrode, an electrostatic attraction force is generated between the electrostatic chuck 20 and the substrate W. Due to the generated electrostatic attraction force, the substrate W is attracted to the electrostatic chuck 20 and held by the electrostatic chuck 20.

The electrostatic chuck 20 includes a substrate placing region. The substrate placing region is a region having a substantially disk shape. The central axis of the substrate placing region is the axis X. The substrate W is placed on the upper surface of the substrate placing region when it is processed in the chamber 10.

In an exemplary embodiment, the electrostatic chuck 20 may further include an edge ring placing region. The edge ring placing region extends in the circumferential direction to surround the substrate placing region around the central axis of the electrostatic chuck 20. The edge ring ER is placed on the upper surface of the edge ring placing region. The edge ring ER may be partially placed on the insulating portion 17.

The plasma processing apparatus 1 may be further provided with a gas supply line 24. The gas supply line 24 supplies a heat transfer gas, for example, a He gas, from a gas supply mechanism to the gap between the upper surface of the electrostatic chuck 20 and the rear surface (lower surface) of the substrate W.

The plasma processing apparatus 1 is further provided with an upper electrode 30. The upper electrode 30 is provided above the substrate support 16. The upper electrode 30 closes an upper opening of the chamber body 12 together with a member 32. The member 32 has insulation properties. The upper electrode 30 is supported on an upper portion of the chamber body 12 through the member 32.

The upper electrode 30 may include a ceiling plate 34 and a support 36. The lower surface of the ceiling plate 34 defines the internal space 10s. A plurality of gas discharge holes 34a are provided in the ceiling plate 34. Each of the plurality of gas discharge holes 34a penetrates the ceiling plate 34 in a plate thickness direction thereof (the vertical direction). The ceiling plate 34 is formed of, for example, silicon. Alternatively, the ceiling plate 34 may have a structure in which a plasma-resistant film is provided on the surface of a member made of aluminum. This film may be a film formed by anodization or a ceramic film such as a film formed of yttrium oxide.

The support 36 detachably supports the ceiling plate 34. The support 36 is formed of a conductive material such as aluminum, for example. The support 36 provides a gas diffusion chamber 36a therein. The support 36 is further provided with a plurality of gas holes 36b. The plurality of gas holes 36b extend downward from the gas diffusion chamber 36a and communicate with the plurality of gas discharge holes 34a, respectively. The support 36 is further provided with a gas introduction port 36c. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply gases from one or more gas sources selected from the plurality of gas sources of the gas source group 40 to the internal space 10s at individually adjusted flow rates.

The plasma processing apparatus 1 may be further provided with a baffle member 48. The baffle member 48 extends between the insulating portion 17 and the side wall of the chamber body 12. The baffle member 48 may be configured, for example, by coating a member made of aluminum with ceramic such as yttrium oxide. A plurality of through-holes are provided in the baffle member 48. A space above the baffle member 48 and a space below the baffle member 48 are connected to each other through the plurality of through-holes of the baffle member 48.

The plasma processing apparatus 1 may be further provided with an exhaust device 50. The exhaust device 50 is connected to the bottom portion of the chamber body 12 below the baffle member 48 through an exhaust pipe 52. The exhaust device 50 has a pressure controller such as an automatic pressure control valve, and a vacuum pump such as a turbo molecular pump, and is capable of reducing the pressure in the internal space 10s.

The plasma processing apparatus 1 is further provided with a radio frequency power source 61. The radio frequency power source 61 generates radio frequency power HF that is supplied to a radio frequency electrode in order to generate plasma above the substrate W supported by the substrate support 16. The radio frequency power HF has a frequency within the range of 27 to 100 MHz, for example, a frequency of 40 MHz or 60 MHz. In an embodiment, the radio frequency electrode is the base 18. That is, in an embodiment, the base 18 provides a lower electrode that is the radio frequency electrode. The radio frequency power source 61 is connected to the base 18 through a matcher 63. The matcher 63 has a matching circuit configured to match the impedance on the load side (the base 18 side) of the radio frequency power source 61 with the output impedance of the radio frequency power source 61. In an embodiment, the radio frequency power source 61 may be connected to the base 18 through the matcher 63 and an electrical path 71. In an embodiment, the electrical path 71 connects a bias power source 62 to the base 18. That is, in an embodiment, the base 18 provides a lower electrode that is a bias electrode.

The bias power source 62 is configured to provide an electric bias BE to the bias electrode (the base 18 in the example of FIG. 1) of the substrate support 16. The electric bias BE may be used to draw ions into the substrate W.

In an embodiment, the bias power source 62 may generate radio frequency bias power as the electric bias BE. The frequency of the radio frequency bias power is different from the frequency of the radio frequency power HF. The frequency of the radio frequency bias power may be lower than the frequency of the radio frequency power HF. The frequency of the radio frequency bias power is a frequency within the range of 50 kHz to 2.7 MHz, and is, for example, 400 kHz. In a case where the radio frequency power source 61 is connected to the upper electrode 30 instead of the base 18, the frequency of the radio frequency bias power that is generated by the bias power source 62 may be lower or higher than the frequency of the radio frequency power HF, and may be the same as the frequency of the radio frequency power HF.

The bias power source 62 is connected to the bias electrode (the base 18 in the example of FIG. 1) through a matcher 64 in order to supply the radio frequency bias power to the bias electrode. The matcher 64 has a matching circuit configured to match the impedance on the load side of the bias power source 62 with the output impedance of the bias power source 62.

The radio frequency bias power may be continuously supplied to the base 18. Alternatively, the radio frequency bias power may be intermittently and periodically supplied to the base 18.

In another embodiment, the bias power source 62 may be configured to apply a pulsed voltage or a voltage having any waveform as the electric bias BE to the bias electrode (the base 18 in the example of FIG. 1). The pulsed voltage may have a negative polarity. The pulsed voltage may be a pulsed negative direct-current voltage. The pulsed voltage may be periodically applied to the base 18. The level of the pulsed voltage may change in a period in which the pulsed voltage is applied to the bias electrode.

In an embodiment, the plasma processing apparatus 1 may be further provided with a first electrode 81. The first electrode 81 is electrically coupled to the edge ring ER. The first electrode 81 may be capacitively coupled to the edge ring ER. The first electrode 81 is disposed below the edge ring ER. In an embodiment, the first electrode 81 may be provided in the edge ring placing region of the electrostatic chuck 20. In another embodiment, the first electrode 81 may be provided in the insulating portion 17. The first electrode 81 may be directly coupled to the edge ring ER. The first electrode 81 may be a single electrode and may extend in the circumferential direction around the axis AX. Alternatively, the first electrode 81 may include a plurality of electrodes arranged along the circumferential direction around the axis AX The plurality of electrodes configuring the first electrode 81 may be arranged at equal intervals.

In an embodiment, the plasma processing apparatus 1 may be further provided with an impedance adjuster 83. The impedance adjuster 83 provides variable impedance. The variable impedance of the impedance adjuster 83 may be controlled by a controller MC (described later). The impedance adjuster 83 is connected between the radio frequency electrode and the edge ring ER. In an embodiment, the impedance adjuster 83 is connected between the radio frequency electrode (the base 18 in the example of FIG. 1) and the first electrode 81. In an embodiment, the impedance adjuster 83 includes one or more variable impedance elements. The one or more variable impedance elements may include a variable capacitance capacitor. In another embodiment, the impedance adjuster 83 may include a circuit composed of a plurality of series circuits connected in parallel. Each of the plurality of series circuits may include a fixed impedance element and a switching element connected in series. The fixed impedance element is, for example, a fixed capacitance capacitor.

In an embodiment, the plasma processing apparatus 1 may be further provided with a second electrode 82. The second electrode 82 is electrically coupled to an outer ring OR. The second electrode 82 may be capacitively coupled to the outer ring OR. The outer ring OR has a ring shape. The outer ring OR may have electrical conductivity. The outer ring OR is for med of, for example, silicon or silicon carbide. The outer ring OR extends outside the edge ring ER in the radial direction. The outer ring OR is disposed such that the central axis thereof coincides with the axis AX. In an embodiment, the outer ring OR extends to surround the edge ring ER. The outer ring OR may be placed on the substrate support 16 or the insulating portion 17.

The second electrode 82 may be disposed below the outer ring OR, as shown in FIG. 1. The second electrode 82 may be provided in the insulating portion 17 or on the surface of the insulating portion 17. The second electrode 82 may be directly coupled to the outer ring OR. The second electrode 82 may be a single electrode and may extend in the circumferential direction around the axis AX. Alternatively, the second electrode 82 may include a plurality of electrodes arranged along the circumferential direction around the axis AX. The plurality of electrodes configuring the second electrode 82 may be arranged at equal intervals.

In the plasma processing apparatus 1, a part of the radio frequency power HF is supplied to the outer ring OR. In an embodiment, the part of the radio frequency power HF is supplied to the outer ring OR through the second electrode 82. The outer ring OR is connected to the electrical path 71 through an impedance adjuster 84. In an embodiment, the second electrode 82 is connected to the electrical path 71 through the impedance adjuster 84. That is, the impedance adjuster 84 is connected between the electrical path 71 and the second electrode 82. The impedance adjuster 84 provides variable impedance. The variable impedance of the impedance adjuster 84 may be controlled by the controller MC. In an embodiment, the impedance adjuster 84 includes one or more variable impedance elements. The one or more variable impedance elements may include a variable capacitance capacitor. In another embodiment, the impedance adjuster 84 may include a circuit composed of a plurality of series circuits connected in parallel. Each of the plurality of series circuits may include a fixed impedance element and a switching element connected in series. The fixed impedance element is, for example, a fixed capacitance capacitor.

In an embodiment, the plasma processing apparatus 1 may be further provided with the controller MC. The controller MC is a computer which includes a processor, a storage device, an input device, a display device, and the like, and controls each part of the plasma processing apparatus 1. Specifically, the controller MC executes a control program stored in the storage device and controls each part of the plasma processing apparatus 1, based on recipe data stored in the storage device. A process designated by the recipe data is performed in the plasma processing apparatus 1 under the control by the controller MC.

The controller MC may be configured to control the impedance adjuster 83 and the impedance adjuster 84 to set the impedance of the impedance adjuster 83 and the impedance of the impedance adjuster 84.

The plasma processing apparatus 1 may be further provided with one or more sensors. The one or more sensors may include sensors that measure the distribution of the plasma density in the internal space 10s. The one or more sensors may include sensors that measure the voltage of each of the substrate W, the edge ring ER, and the outer ring OR. The one or more sensors may include sensors that measure the current flowing through each of the substrate W, the edge ring ER, and the outer ring OR. The one or more sensors may include sensors that measure emission intensity distribution in the internal space 10s. The controller MC may control the impedance adjuster 83 and the impedance adjuster 84 according to one or more measured values obtained by the measurement with the one or more sensors, to set the impedance of the impedance adjuster 83 and the impedance adjuster 84.

Alternatively, the controller MC may control the impedance adjuster 83 and the impedance adjuster 84 by using the data set in advance according to the tendency of the process that is executed according to the recipe data, to set the impedance of the impedance adjuster 83 and the impedance adjuster 84. Alternatively, the controller MC may control the impedance adjuster 83 and the impedance adjuster 84 by using the data according to the execution time length of the process that is executed according to the recipe data, to set the impedance of the impedance adjuster 83 and the impedance adjuster 84. Alternatively, the controller MC may control the impedance adjuster 83 and the impedance adjuster 84 by using the data according to the wear prediction of the edge ring ER and the outer ring OR, to set the impedance of the impedance adjuster 83 and the impedance adjuster 84.

In a case where the plasma processing is performed in the plasma processing apparatus 1, a gas is supplied to the internal space 10s. Then, the radio frequency power HF and/or the electric bias BE is supplied, whereby the gas is excited in the internal space 10s. As a result, plasma is generated in the internal space 10s. The substrate W is processed with chemical species such as ions and radicals from the generated plasma. For example, the substrate is etched by the chemical species from the plasma.

In the plasma processing apparatus 1, the distribution ratio of the electric bias BE between the bias electrode (the base 18 in the example of FIG. 1) and the edge ring ER is adjusted by the impedance adjuster 83. Therefore, the level of a negative bias in the edge ring ER is adjusted by the impedance adjuster 83. Therefore, according to the plasma processing apparatus 1, it becomes possible to adjust the thickness of the sheath on the edge ring ER.

Further, in the plasma processing apparatus 1, a part of the radio frequency power HF is supplied to the outer ring OR. The distribution ratio of the radio frequency power HF between the radio frequency electrode (the base 18 in the example of FIG. 1) and the outer ring OR is adjusted by the impedance adjuster 84. Therefore, according to the plasma processing apparatus 1, the density of the plasma is adjusted even above the outer ring OR. Therefore, according to the plasma processing apparatus 1, it becomes possible to adjust the distribution of the density of the plasma in the radial direction in the space that also includes the region outside the region on the edge ring ER.

In an embodiment, the electrical path 71 may be configured to uniformly distribute electric power to the base 18 in the circumferential direction with respect to the axis AX. In an embodiment, the electrical path 71 may include a plurality of branch lines which are respectively connected to a plurality of positions of the base 18. The plurality of positions have the same distance from the axis AX and are arranged at equal intervals in the circumferential direction with respect to the axis AX. Further, the plurality of branch lines of the electrical path 71 are arranged at equal intervals in the circumferential direction with respect to the axis AX. Further, the electrical lengths of the electrical path 71 with respect to each of the plurality of positions of the base 18 are substantially equal to each other. According to this embodiment, it becomes possible to uniformly supply electric power to the base 18 through the electrical path 71.

In an embodiment, the plasma processing apparatus 1 may be further provided with an electrical path 72. The electrical path 72 is an electrical path for the electric power that is distributed between the bias electrode (the base 18 in the example of FIG. 1) and the edge ring ER (or the first electrode 81) to be supplied to the edge ring ER. The electrical path 72 may include a plurality of branch lines which are respectively connected to a plurality of positions of the edge ring ER (or the first electrode 81). The plurality of positions have the same distance from the axis AX and are arranged at equal intervals in the circumferential direction with respect to the axis AX. Further, the plurality of branch lines of the electrical path 72 are arranged at equal intervals in the circumferential direction with respect to the axis AX. Further, the electrical lengths of the electrical path 72 with respect to each of the plurality of positions of the edge ring ER (or the first electrode 81) are substantially equal to each other. According to this embodiment, it becomes possible to uniformly supply electric power to the edge ring ER through the electrical path 72.

In an embodiment, the plasma processing apparatus 1 may be further provided with an electrical path 73. The electrical path 73 is an electrical path for the electric power that is distributed between the radio frequency electrode (the base 18 in the example of FIG. 1) and the outer ring OR (or the second electrode 82) to be supplied to the outer ring OR. The electrical path 73 may include a plurality of branch lines which are respectively connected to a plurality of positions of the outer ring OR (or the second electrode 82). The plurality of positions have the same distance from the axis AX and are arranged at equal intervals in the circumferential direction with respect to the axis AX. Further, the plurality of branch lines of the electrical path 73 are arranged at equal intervals in the circumferential direction with respect to the axis AX. Further, the electrical lengths of the electrical path 73 with respect to each of the plurality of positions of the outer ring OR (or the second electrode 82) are substantially equal to each other. According to this embodiment, it becomes possible to uniformly supply electric power to the outer ring OR through the electrical path 73.

In an embodiment, the plasma processing apparatus 1 may be further provided with a filter 74. The filter 74 is connected between the impedance adjuster 84 and the outer ring OR (or the second electrode 82). The filter 74 may have a frequency characteristic that selectively passes the radio frequency power HF with respect to the electric bias BE. Alternatively, the filter 74 may have a frequency characteristic that selectively passes the electric bias BE with respect to the radio frequency power HF. Alternatively, the pass band of the filter 74 may be able to be changed to either the band of the radio frequency power HF or the band of the electric bias BE, or both of the bands.

Figure 2:
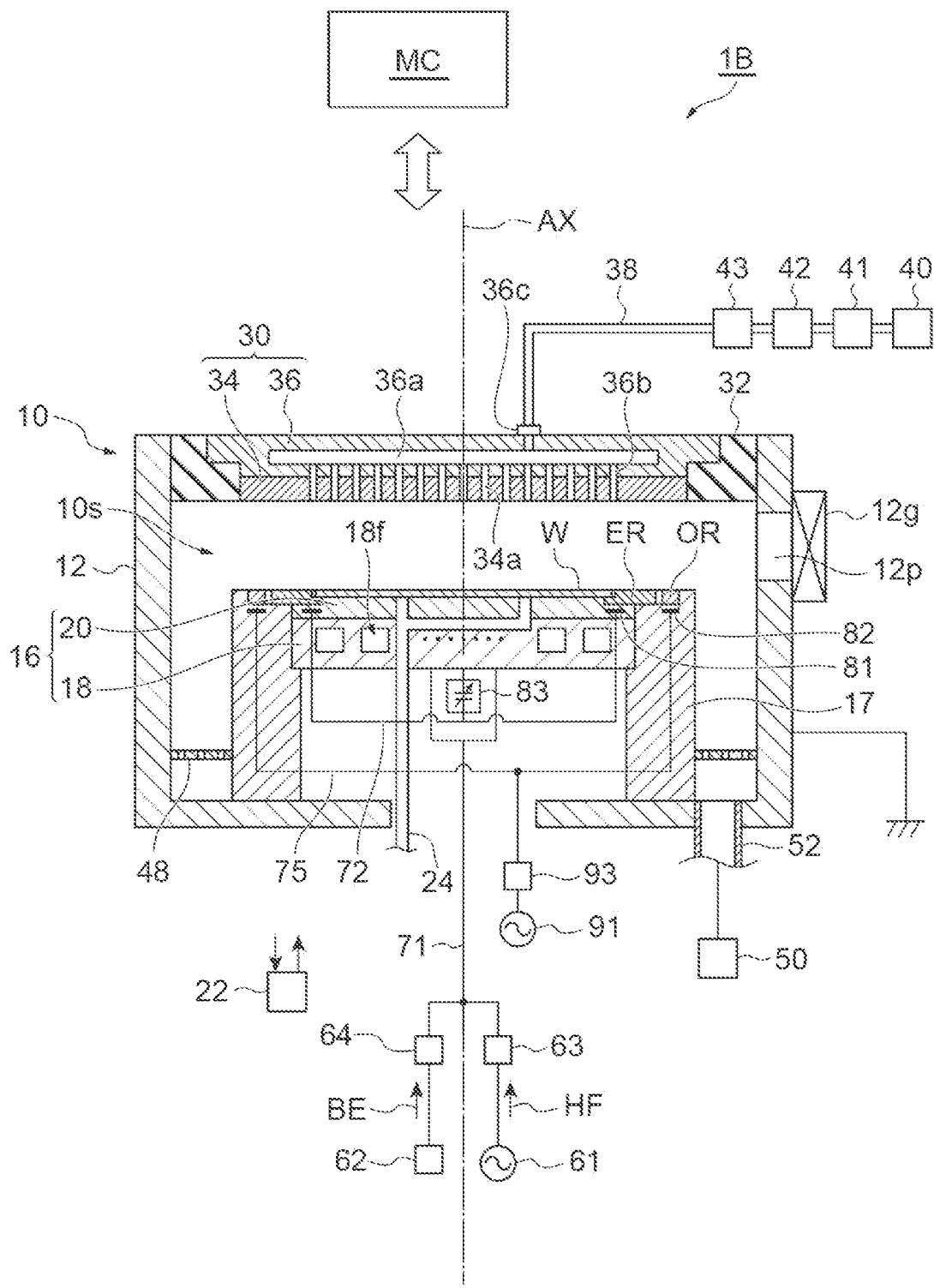
FIG. 2 schematically illustrates a plasma processing apparatus according to another exemplary embodiment.

Hereinafter, FIG. 2 will be referred to. FIG. 2 is a diagram schematically showing a plasma processing apparatus according to another exemplary embodiment. Hereinafter, differences between a plasma processing apparatus 1B shown in FIG. 2 and the plasma processing apparatus 1 will be described.

The plasma processing apparatus 1B is not provided with the impedance adjuster 84. The plasma processing apparatus 1B is further provided with a radio frequency power source 91. The radio frequency power source 91 is configured to generate radio frequency power that is supplied to the outer ring OR. The frequency of the radio frequency power that is generated by the radio frequency power source 91 may be the same as or different from the frequency of the radio frequency power HF.

The radio frequency power source 91 is connected to the outer ring OR through a matcher 93 and an electrical path 75. The radio frequency power source 91 may be connected to the second electrode 82 through the matcher 93 and the electrical path 75. The matcher 93 has a matching circuit configured to match the impedance on the load side of the radio frequency power source 91 with the Output impedance of the radio frequency power source 91.

In an embodiment, the electrical path 75 may include a plurality of branch lines which are respectively connected to a plurality of positions of the outer ring OR (or the second electrode 82). The plurality of positions have the same distance from the axis AX and are arranged at equal intervals in the circumferential direction with respect to the axis AX. Further, the plurality of branch lines of the electrical path 75 are arranged at equal intervals in the circumferential direction with respect to the axis AX. Further, the electrical lengths of the electrical path 75 with respect to each of the plurality of positions of the outer ring OR (or the second electrode 82) are substantially equal to each other. According to this embodiment, it becomes possible to uniformly supply electric power to the outer ring OR through the electrical path 75.

In the plasma processing apparatus 1B, the controller MC may further control the radio frequency power source 91 according to one or more measured values obtained by the measurement with the one or more sensors described above with respect to the plasma processing apparatus 1, to set the level of the radio frequency power that is generated by the radio frequency power source 91.

Alternatively, the controller MC may further control the radio frequency power source 91 by using the data set in advance according to the tendency of the process that is executed according to the recipe data, to set the level of the radio frequency power that is generated by the radio frequency power source 91. Alternatively, the controller MC may further control the radio frequency power source 91 by using the data according to the execution time length of the process that is executed according to the recipe data, to set the level of the radio frequency power that is generated by the radio frequency power source 91. Alternatively the controller MC may further control the radio frequency power source 91 by using the data according to the wear prediction of the edge ring ER and the outer ring OR, to set the level of the radio frequency power that is generated by the radio frequency power source 91.

Figure 3:
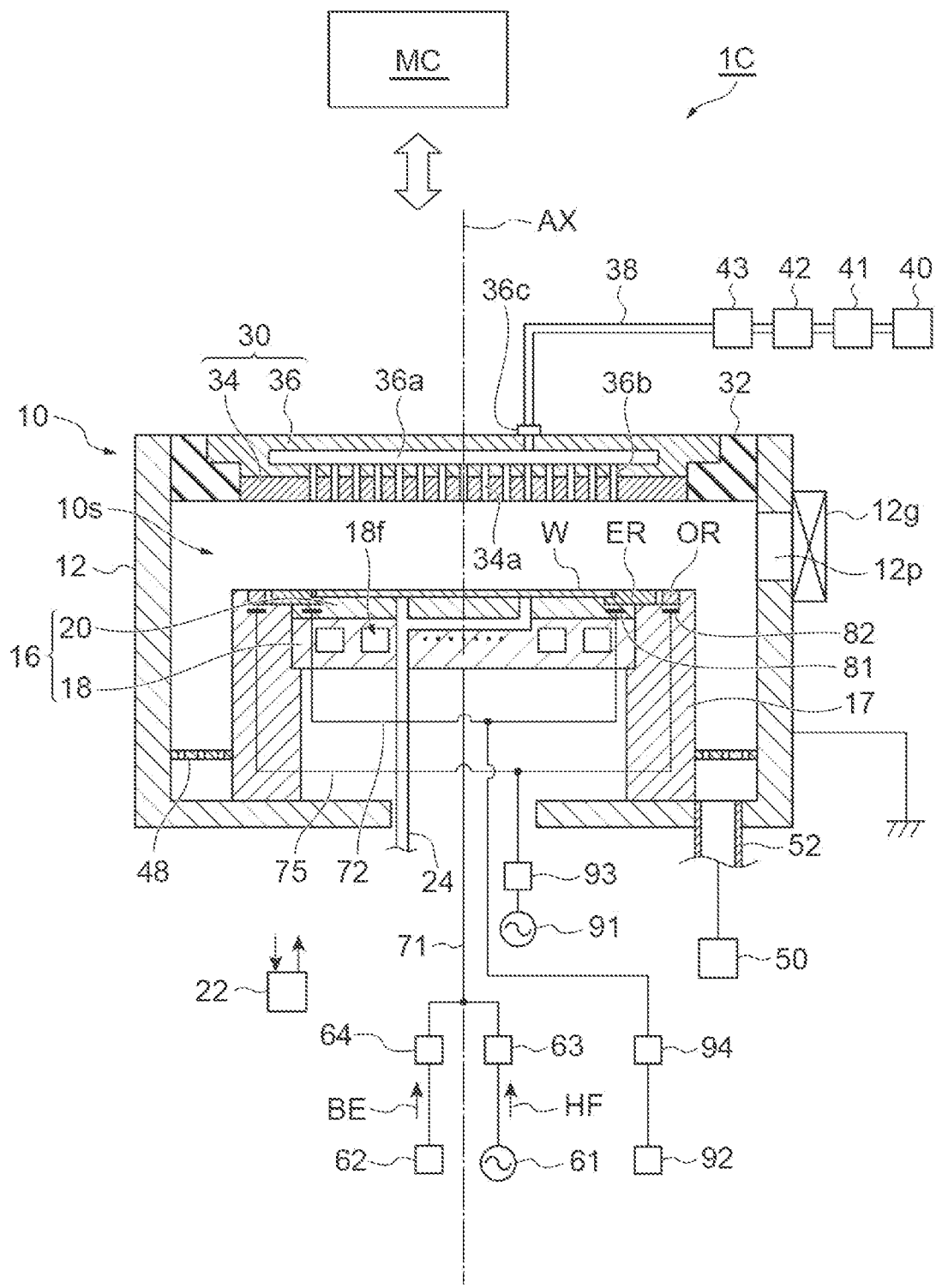
FIG. 3 schematically illustrates a plasma processing apparatus according to still another exemplary embodiment.

Hereinafter, FIG. 3 will be referred to. FIG. 3 is a diagram schematically showing a plasma processing apparatus according to still another exemplary embodiment. Hereinafter, differences between a plasma processing apparatus 1C shown in FIG. 3 and the plasma processing apparatus 1B will be described.

The plasma processing apparatus 1C is not provided with the impedance adjuster 83. In the plasma processing apparatus 1C, a bias power source 92 is connected to the edge ring ER (or the first electrode 81) through a matcher 94 and the electrical path 72. The bias power source 92 is the same power source as the bias power source 62. The matcher 94 includes a matching circuit for matching the impedance on the load side of the bias power source 92 with the output impedance of the bias power source 92.

In the plasma processing apparatus 1C, the controller MC may further control the bias power source 92 according to one or more measured values obtained by the measurement with the one or more sensors described above with respect to the plasma processing apparatus 1, to set the level of the electric bias that is generated by the bias power source 92.

Alternatively, the controller MC may further control the bias power source 92 by using the data set in advance according to the tendency of the process that is executed according to the recipe data, to set the level of the electric bias that is generated by the bias power source 92. Alternatively, the controller MC may further control the bias power source 92 by using the data according to the execution time length of the process that is executed according to the recipe data, to set the level of the electric bias that is generated by the bias power source 92. Alternatively, the controller MC may further control the bias power source 92 by using the data according to the wear prediction of the edge ring ER and the outer ring OR, to set the level of the electric bias that is generated by the bias power source 92.

In the plasma processing apparatus 1C, another radio frequency power source that generates radio frequency power may be electrically connected to the edge ring ER (or the first electrode 81) through a matcher.

Figure 4:
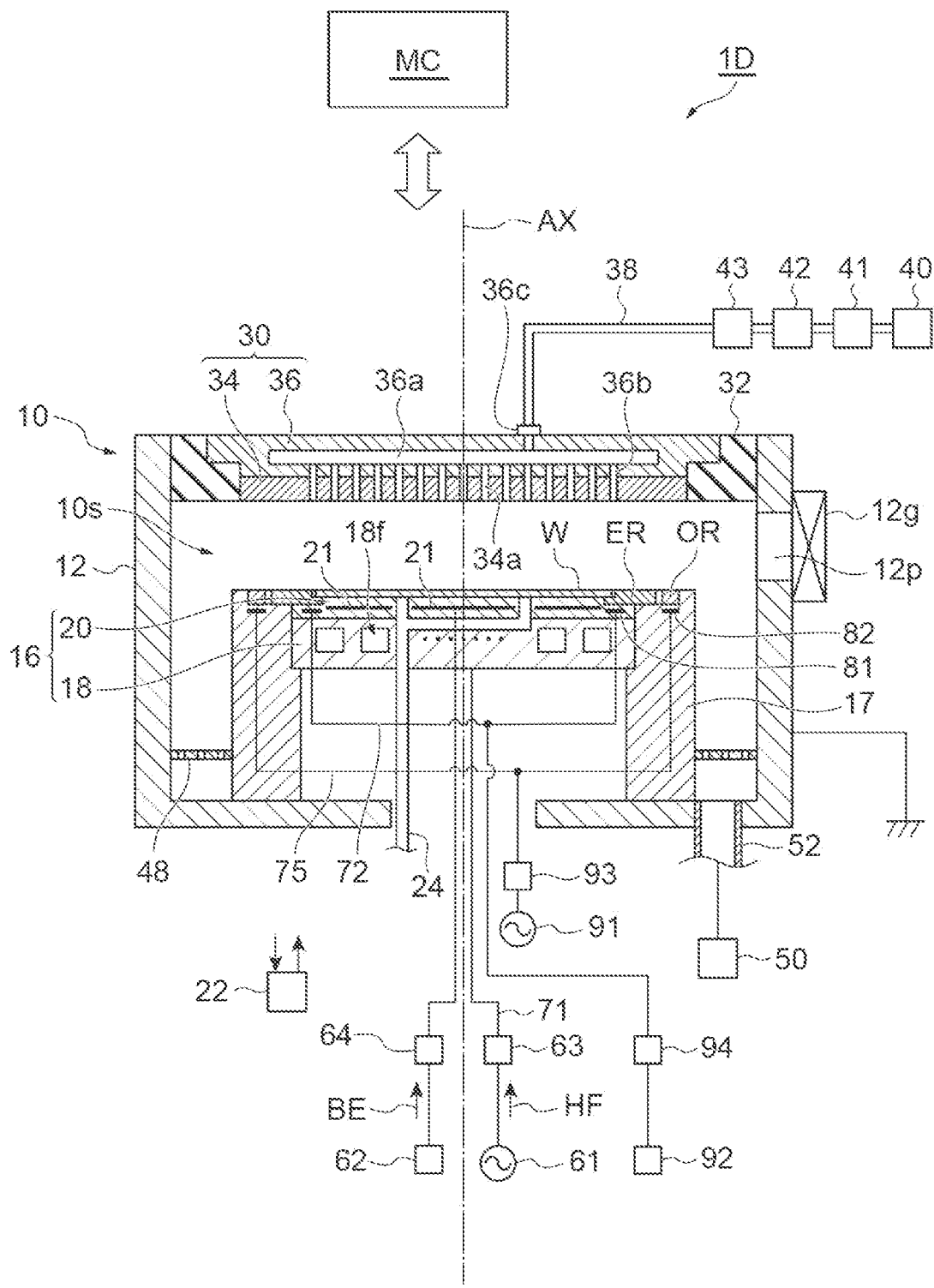
FIG. 4 schematically illustrates a plasma processing apparatus according to still yet another exemplary embodiment.

Hereinafter, FIG. 4 will be referred to. FIG. 4 is a diagram schematically showing a plasma processing apparatus according to still yet another exemplary embodiment. Hereinafter, differences between a plasma processing apparatus 1D shown in FIG. 4 and the plasma processing apparatus 1C will be described. In the plasma processing apparatus 1D, a bias electrode 21 is provided in the electrostatic chuck 20. The bias electrode 21 may also serve as the chuck electrode, or may be an electrode different from the chuck electrode. In the plasma processing apparatus 1D, the bias power source 62 is connected to the bias electrode 21 through an electrical path different from the electrical path 71.

While various exemplary embodiments have been described above, various additions, omissions, substitutions and changes may be made without being limited to the exemplary embodiments described above. Elements of the different embodiments may be combined to form another embodiment.

For example, in another embodiment, the radio frequency power source 61 may be connected to the upper electrode 30 instead of the base 18 through the matcher 63. In this case, the upper electrode 30 is used as the radio frequency electrode.

In still another embodiment, in a case where the radio frequency power source 61 is connected to the base 18 through the electrical path 71, the impedance adjuster 83 may be connected between the electrical path 71 and the edge ring ER (or the first electrode 81).

In still another embodiment, the outer ring OR may be disposed at a position higher than the position in the vertical direction of the edge ring ER. In still another embodiment, the outer ring OR may be disposed to surround the upper electrode 30. In this case, the outer ring OR may be disposed in the member 32.

In still another embodiment, the impedance adjuster 84 may be connected between the base 18 and the outer ring OR (or the second electrode 82).

In still another embodiment, another bias power source may be connected to the outer ring OR (or the second electrode 82) through the electrical path 75. The other bias power source may generate the radio frequency bias power that is supplied to the outer ring OR, or may periodically generate a pulsed voltage or a voltage having any waveform, which is applied to the outer ring OR.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A plasma processing apparatus comprising:
a chamber;
a substrate support having a conductive base and an electrostatic chuck on the conductive base, the conductive base configuring a bias electrode, and the electrostatic chuck including a substrate placing region to support a substrate placed thereon and an edge ring placing region to support an edge ring placed thereon, the edge ring placing region surrounding the substrate placing region;

an insulating member surrounding the substrate support;

a radio frequency power source configured to generate radio frequency power that is supplied to the conductive base to generate plasma above a substrate supported by the substrate support in the chamber, the radio frequency power source being connected to the conductive base through an electrical path;

a bias power source connected to the conductive base through the electrical path;

a first electrode disposed in the edge ring placing region of the electrostatic chuck and capacitively coupled with the edge ring placed on the edge ring placing region;

a second electrode disposed in the insulating member and capacitively coupled with an outer ring placed on the insulating member, the outer ring extending outside the edge ring in a radial direction;

a first impedance adjuster electrically connected between the conductive base and the first electrode or between the electrical path and the first electrode, and providing variable impedance between the conductive base and the edge ring or between the electrical path and the edge ring; and a second impedance adjuster electrically connected between the electrical path and the second electrode and providing variable impedance between the electrical path and the outer ring.

2. The plasma processing apparatus according to claim 1, further comprising:

a filter connected between the second impedance adjuster and the second electrode, wherein the filter has a frequency characteristic that selectively passes the radio frequency power with respect to an electric bias that is supplied from the bias power source to a lower electrode.

* * * * *